(12) United States Patent
Lochmann et al.

(10) Patent No.: US 9,510,393 B2
(45) Date of Patent: Nov. 29, 2016

(54) APPARATUS FOR HEATING SURFACES IN THE INTERNAL SPACE OF A MOTOR VEHICLE

(71) Applicant: I.G. BAUERHIN GMBH, Gruendau (DE)

(72) Inventors: Karl Lochmann, Gruendau (DE); Dieter Barthel, Rodenbach (DE)

(73) Assignee: I. G. BAUERHIN GMBH, Gruendau (DE)

( * ) Notice: Subject to any disclaimer, the term of this patent is extended or adjusted under 35 U.S.C. 154(b) by 6 days.

(21) Appl. No.: 14/706,042

(22) Filed: May 7, 2015

(65) Prior Publication Data

US 2015/0327330 A1    Nov. 12, 2015

(51) Int. Cl.
| | |
|---|---|
| *H05B 1/02* | (2006.01) |
| *H05B 3/26* | (2006.01) |
| *H05B 3/34* | (2006.01) |
| *H05K 1/02* | (2006.01) |
| *H05K 1/11* | (2006.01) |

(52) U.S. Cl.
CPC .............. *H05B 1/0236* (2013.01); *H05B 3/26* (2013.01); *H05B 3/34* (2013.01); *H05K 1/0265* (2013.01); *H05B 2203/003* (2013.01); *H05B 2203/016* (2013.01); *H05B 2203/029* (2013.01); *H05K 1/0212* (2013.01); *H05K 1/117* (2013.01); *H05K 2201/062* (2013.01); *H05K 2201/09063* (2013.01); *H05K 2201/09081* (2013.01); *H05K 2201/10151* (2013.01)

(58) Field of Classification Search
CPC ........ H05B 1/0236; H05B 3/26; H05B 3/34; H05B 2203/003; H05B 2203/016; H05K 1/0212; H05K 1/117; H05K 2201/09081; H05K 2201/10151; H05K 1/0265; H05K 2201/062; H05K 2201/09063
USPC ........ 219/494, 202, 203, 539, 540, 541, 546
See application file for complete search history.

(56) References Cited

U.S. PATENT DOCUMENTS

| | | | |
|---|---|---|---|
| 6,285,004 B1 * | 9/2001 | Arold ................... | B60H 1/0005 165/41 |
| 2005/0047768 A1 * | 3/2005 | Kuebler .................. | B60S 1/488 392/493 |
| 2006/0096251 A1 * | 5/2006 | Donges ................... | B29C 51/42 53/453 |
| 2006/0250830 A1 * | 11/2006 | Lanni ....................... | G06F 1/26 363/80 |

(Continued)

*Primary Examiner* — Mark Paschall
(74) *Attorney, Agent, or Firm* — Karl F. Milde, Jr.; Eckert Seamans Cherin & Mellott, LLC

(57) ABSTRACT

An apparatus for heating surfaces in the internal space of a motor vehicle comprises at least one heating element, having at least one heating conductor that forms an electrical heating circuit, and at least one carrier material, wherein the heating conductor has at least two HC terminal ends and the temperature acquisition element has at least two TA terminal ends. This apparatus for heating is characterized in that at least two of the HC and TA terminal ends are electrically connected to first HC terminal areas or first TA terminal areas of a printed circuit board and in that the printed circuit board has second HC terminal areas and second TA terminal areas, wherein the first HC terminal areas and the second HC terminal areas are at least in part connected to each other via first pcb traces and the first TA terminal areas and the second TA terminal areas via second pcb traces, wherein the first and the second pcb traces are part of the printed circuit board, and wherein the printed circuit board is arranged on, under or at the at least one carrier material.

10 Claims, 5 Drawing Sheets

(56) References Cited

U.S. PATENT DOCUMENTS

2006/0259788 A1* 11/2006 Elbert .................. G06F 21/87
                                                    713/194

2008/0000889 A1* 1/2008 Niederer .............. B60H 1/2221
                                                    219/205

* cited by examiner

APPARATUS FOR HEATING SURFACES IN THE INTERNAL SPACE OF A MOTOR VEHICLE

BACKGROUND OF THE INVENTION

The present invention relates to an apparatus for heating surfaces in the internal space of a motor vehicle.

Such an apparatus, with temperature acquisition associated with it, comprises at least one heating element having at least one heating conductor forming an electrical heating circuit, and at least one carrier material holding the heating conductor. The heating conductor has at least two heating conductor terminal ends (HC terminal ends) and the temperature acquisition element has at least two temperature acquisition element terminal ends (TA terminal ends).

Hereinafter, the abbreviation "HC", refers to "heating conductor", the abbreviation "TA" refers to "temperature acquisition" and "pcb" refers to "printed circuit board".

Such apparatuses are used for heating surfaces in the internal space of motor vehicles, for example for heating steering wheels, seats, armrests, car mats, and ultimately for heating all possible surfaces within a motor vehicle that can be touched by a user.

Such apparatuses for heating usually have a temperature acquisition element in order to acquire the temperature in the heating area. As a consequence, such an apparatus for heating has terminal ends for the temperature acquisition element in addition to the terminal ends for the heating conductor. These connection parts must be designed such that they allow for a simple, easily accessible connection.

In the terminal area, wires serving as heating conductors or leads of the temperature acquisition device are twisted together or soldered together with the wires of the terminal leads and are insulated using heat shrink tubing, for example. In many cases these elements are also secured using glue and/or covers for strain relief. This process is laborious to carry out, and in particular the positioning of solder joints is, if possible at all, difficult to reproduce.

The objective of the present invention is to design a heating apparatus of the aforementioned kind such that the connection of the heating element with its connectors to the leads can be made reproducibly, and furthermore of providing the option of coupling the temperature acquisition element, thermally defined, to the heating conductor.

This objective is achieved, according to the present invention, by providing a heating apparatus wherein at least two of the HC and TA terminal ends are electrically connected to first HC terminal areas or first TA terminal areas of a printed circuit board and wherein the printed circuit board has second HC terminal areas and second TA terminal areas. The first HC terminal areas and the second HC terminal areas are, at least in part, connected to each other using first pcb traces and the first TA terminal areas and the second TA terminal areas are connected using second pcb traces, wherein the first and the second pcb traces are part of a printed circuit board, and wherein the printed circuit board is arranged on, under or at the carrier material.

Both the heating element and the temperature acquisition element are connected to electronics or an evaluation unit via the terminal areas arranged on the printed circuit board, i.e., the HC terminal areas (heating conductor terminal areas) and the TA terminal areas (temperature acquisition terminal areas). This process can be automated at least in part, especially since these terminal areas are located on the printed circuit board, which is preferably dimensioned very small. These terminal areas are pre-specified on the printed circuit board making it possible to reproduce and automate the processing steps.

For example, if the heating apparatus is provided for a steering wheel, the printed circuit board is positioned at a suitable area, for example at the steering wheel rim or the steering wheel hub. Prior to positioning and connecting the terminal ends for the heating conductor of the heating element (HC terminal ends) and the terminal ends for the temperature acquisition element (TA terminal ends) to the respective terminal areas located on the printed circuit board (first HC terminal areas and first TA terminal areas), the connections to the power supply for the heating conductor and the electrical connections to the temperature acquisition element and/or the connections to the electronics or evaluation unit are attached in preparation to the other ends of the pcb traces, i.e., to the second HC terminal areas and the second TA terminal areas. These attachments to the terminal areas can be carried out by soldering, crimping, welding or gluing, for example. An electrically conducting adhesive should be used for the aforementioned connection by gluing.

Such a printed circuit board is intended to be connected to parts of the steering wheel, for example, via a plug-type or also a clip-type connection. It is possible to dimension the printed circuit board in a sufficiently small design size such that it can be arranged in a steering wheel spoke of a steering wheel blank, and there preferably in an appropriately adapted recess. There, the terminal ends of the heating element or the heating conductor, respectively, and the terminal ends of the temperature acquisition element can be connected to the corresponding terminal areas of the pcb traces that are assigned to them.

The shape of the printed circuit board can be adapted to the circumstances by using a rectangular or a square shape. The corners can be rounded; however, an oval or trapezoidal shape in the top view of the printed circuit board is also provided.

The apparatus for heating with heating conductor and temperature acquisition element is particularly suited for heating small surface areas in the internal space of a motor vehicle, where only limited space is available for installing the connection elements that are associated with the heating conductor and the temperature acquisition element. In addition to heating a steering wheel, this apparatus is therefore also particularly well suited for heating a shift knob of a gearshift lever, an armrest or a grip handle. It is furthermore provided to employ such an apparatus for heating for trim components, for example of the door or the side sections of a motor vehicle, namely especially in areas where there is only limited space available for the connection components.

The printed circuit board has at least one first terminal area (first HC terminal area) that is associated with the terminal ends of the heating element's heating conductor, and at least one first terminal area (first TA terminal area) that is associated with the at least one first terminal ends of the temperature acquisition element. However, additional terminal areas can be provided as well that are associated with the additional terminal ends of the temperature acquisition element or the heating conductor.

Preferably, the one terminal areas, i.e., the first HC terminal areas and the first TA terminal areas, are arranged in the vicinity of an edge of the electrically insulating carrier material of the printed circuit board; the pcb traces then run preferably from this edge to the other terminal areas, i.e., the second HC terminal areas and the second TA terminal areas at the edge on the opposite side of the printed circuit board.

In one particularly preferred embodiment, the pcb trace(s) for the temperature acquisition element run(s) between the pcb traces for the heating conductor of the heating element.

Precisely in such an arrangement can the temperature acquisition element be connected directly to the two pcb traces that run between the pcb traces for the heating element, i.e., without additional wires between the temperature acquisition element and the terminal ends of the pcb traces. In particular, in such an arrangement, the heat emitted by the pcb traces of the heating element is detected by the temperature acquisition element and the temperature or the heating power of the heating element, respectively, is set dependant thereupon. When arranging the temperature acquisition element directly on the printed circuit board, it is possible to pre-populate the printed circuit board with a temperature acquisition element, for example as an SMD component (surface mounted device), and after installation of the apparatus for heating the temperature acquisition element will be reproducibly at an identical location in fixed association to the heating conductor or the heating element, or the pcb traces associated thereto, respectively, for the evaluation unit/electronics of the heating element.

It is also provided that the temperature acquisition element is in contact with a heat storing material in order to set the thermal inertia of the temperature acquisition element for the temperature control. Such heat storage can be arranged directly on the printed circuit board, for example by applying solder or through an SMD component on the printed circuit board.

The pcb trace(s) for the temperature acquisition element should be designed as web(s) with essentially equal widths, preferably as narrow pcb traces with a width of 0.2 mm to 1 mm each, even more preferred as narrow pcb traces with a width of 0.2 mm to 0.5 mm each. In contrast, the width of each pcb trace for the heating element or the heating conductor, respectively, is provided to be at least four times the width of a pcb trace for the temperature acquisition element. The maximum width of the pcb traces for the heating element should be in a range of 8 mm to 15 mm each. Preferably, the maximum width of the pcb traces for the heating element should be in a range of 8 mm to 10 mm each.

The conductor resistance of the respective pcb trace can be set via the shape and the trace route of the respective pcb trace on the printed circuit board and/or via the thickness of the pcb trace.

The preferred dimensions of the printed circuit board are 30 mm at most in each direction. Preferably, the dimensions vary from 10 mm to 30 mm. The printed circuit board can have a thickness of 0.3 mm to 5 mm; thin printed circuit board material should be used where thin, flexible heating elements or heating conductors, respectively are used and where adaptable and little thickening materials are required, for example at the steering wheel, while thicker materials for the printed circuit board should be used where mechanical stability and thus little warping has priority such as in a motor vehicle seat or in door panels. It is also provided to use a flexible printed circuit board where respective areas should adapt during installation.

To set the heat transfer through thermal conduction from the pcb traces that are correlated with the heating conductor, for example to a temperature acquisition element, which is also located on the printed circuit board, material of the carrier board is removed in the area of the temperature acquisition element between the respective pcb trace for the temperature acquisition element and the respective adjacent pcb trace for the heating element or the heating conductor, respectively, or the printed circuit board is provided with a penetration in this area. The thermal conductance from the pcb traces of the heating circuit to the temperature acquisition element can be set via the quantity of the material removed from the printed circuit board. A penetration of the carrier board, wherein such a penetration can also be referred to as an insection, should have a width of 0.3 to 3 mm, 1.5 to 2.5 mm, preferred of about 2 mm viewed in the plane of the carrier board. The thermal coupling can also be set via the material selection for the printed circuit board.

The connections of the terminal ends of the input leads and the connections of the heating conductor and the terminal ends of the temperature acquisition element with the respective associated terminal areas of the printed circuit board can be soldered, crimped, welded but also glued; the latter preferably using an electrically conducting adhesive. The thickness of the pcb trances, perpendicular to the plane of the printed circuit board is in a range of 30 μm-70 μm. As previously stated, the resistance of the pcb trace can be set via the shape and/or the route of the pcb trace. The resistance is decreased and thus the heat generation along the pcb trace of the heating conductor is reduced when using larger areas and greater thicknesses (greater cross-sectional areas). The pcb traces for the temperature acquisition element can be designed thin and narrow relative to the pcb traces of the heating circuit, for example with cross-sectional dimensions of 0.2 mm (material width)×30 μm (material thickness).

The thinner or narrower the pcb traces for the temperature acquisition element are designed, the fewer interferences will occur for the temperature acquisition element due the amount of heat generated across these pcb traces.

The invention can also be described as an apparatus with temperature acquisition for heating surfaces in the internal space of a motor vehicle having at least one heating element consisting of at least one heating circuit and one temperature acquisition element. The heating element has at least two terminal ends that can be connected to a power supply via connection lines. The temperature acquisition element has two contact ends, wherein at least one of these contact ends can be connected to electronics (evaluation electronics) via a connection lead. One respective pcb trace, which is part of a trace structure of an electrically insulating carrier board or printed circuit board, respectively, is located between the terminal ends and the respective associated terminal leads of the heating element and between the at least one contact end and the associated connection lead of the temperature acquisition element.

When reference is made in the description to the heating element, then this heating element also includes at least a carrier material to which a heating conductor is connected. This one heating conductor forms a heating circuit between its terminal ends. However, multiple heating conductors can also be arranged on the carrier material, wherein each of these heating conductors can form an autonomous heating circuit.

For a full understanding of the present invention, reference should now be made to the following detailed description of the preferred embodiments of the invention as illustrated in the accompanying drawings.

DESCRIPTION OF THE PREFERRED EMBODIMENT

Figure 1A:
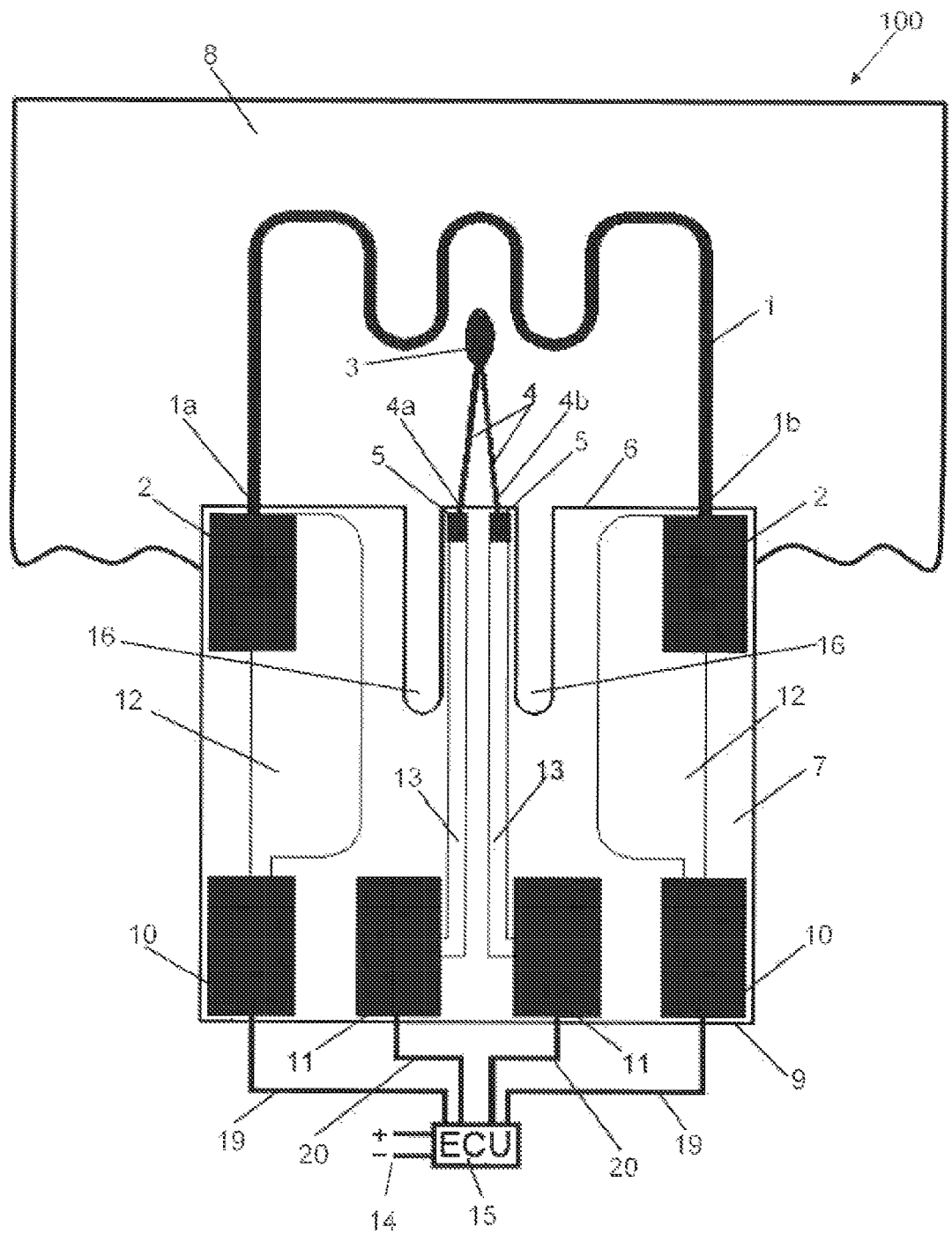
FIG. 1A shows an apparatus for heating according to the invention in a magnified schematic top view.

The apparatus for heating as shown in FIG. 1A comprises a heating element 100 having a heating circuit in the shape of an individual heating conductor 1, which with its two HC terminal ends (heating conductor terminal ends) 1a, 1b is connected to two HC terminal areas (heating conductor terminal areas) 2 of a printed circuit board 7, as well as a temperature acquisition element 3 having two TA terminal ends (temperature acquisition element terminal ends) 4a, 4b that are connected to two first TA terminal areas (temperature acquisition element terminal areas) 5 of the printed circuit board 7.

This first TA terminal area 5 for the temperature acquisition element 3 and the first HC terminal area 2 for the heating conductor 1 of the heating element 100 are arranged on one side, designated with the reference sign 6, of the printed circuit board 7. This printed circuit board 7 is shown greatly magnified in particular in FIG. 1. Located on the other side of this printed circuit board 7, which is located opposite of the side 6 with the first HC terminal areas 2 and the first TA terminal areas 5 and is designated with the reference side 9, are four additional terminal areas, wherein two each of these terminal areas, designated with the reference sign 10, are associated with the heating conductor 1 (second HC terminal area 10), while the other two terminal areas, with the reference sign 11, are associated with the temperature acquisition element 3 (second TA terminal area 11).

One pcb trace 12, 13 each extends between the first HC terminal areas 2 and the second HC terminal areas 10 and between the first TA terminal areas 5 and the second TA terminal areas 11 such that the terminal areas 2 and 5 are each electrically connected to the respective associated terminal areas 10 and 11. The two second HC terminal areas 10 are electrically connected to an electronics or evaluation unit 15 (ECU electronic control unit) for the heating conductor 1 of the heating element 100 via terminal leads 19, while the two second TA terminal areas 11 that are associated with the temperature acquisition element 3 are connected to the electronics or evaluation unit 15 (ECU) via connection leads 20.

The printed circuit board 7 has a square shape with a preferred lateral length of about 30 mm; the dimensions can vary in a range from 15 mm to 40 mm. The thickness of the printed circuit board 7 is in a range from 0.5 mm to 2 mm.

In order to install the apparatus for heating a surface in the internal space of a motor vehicle and to connect both the heating conductor 1 and the temperature acquisition element 3 electrically to the electronics or evaluation unit 15 (ECU), the printed circuit board 7 is positioned at a suitable place in the area of the surface to be heated, wherein the heating conductor 1 is already connected to the first terminal areas 2 and the temperature acquisition element 3 is already connected to the first terminal areas 5, while the respective terminal leads 19 for the heating conductor 1 and the connection leads 20 for the temperature acquisition element 3 are then connected to the second terminal areas 10 and 11 in order to connect them with the electronics or evaluation unit (ECU) 15.

It is also not excluded that for the purpose of heating a surface prior to installing the printed circuit board 7 in its final position it is positioned at a suitable location in the area of the surface to be heated, wherein the terminal leads 19 for the heating conductor 1 are already connected to the second terminal areas 10 and the connection leads 20 for the temperature acquisition element 3 are already connection to the second terminal areas 11 in order to connect it to the electronics of evaluation unit (ECU) 15. After final positioning of the printed circuit board 7, the heating conductor 1 is connected to its terminal ends 1a, 1b to the first HC terminal areas 2 and the temperature acquisition element 3 with its terminal ends 4a, 4b to the first TA terminal area 5. It can be advantageous that the printed circuit board 7 already has the temperature acquisition element 3 populated as an SMD component prior to final positioning.

For the purpose of heating a surface in the internal space of a motor vehicle, the apparatus for heating is initially connected to the terminal leads 19 for the heating conductor 1 and to the connection leads 20 for the temperature acquisition element 3 via the respective terminal areas 2, 5, 10, 11 of the printed circuit board 7 prior to installation; the apparatus for heating is then affixed to the surface to be heated in the internal space of the motor vehicle.

Thus, reproducible connection conditions are established through the printed circuit board 7 inside the motor vehicle for the heating element 100, for the heating conductor 1, the temperature acquisition element 3 as well as for the electronics or evaluation unit 15 (ECU) such that these processes can be carried out at least in part automated. Also advantageously, the printed circuit board 7 can for this purpose be pre-assembled either with terminal leads or connection leads 19, 20 for the electronics or evaluation unit 15 at the terminal areas 10, 11, or prior to installation of the printed circuit board 7 at its final location, at least the temperature acquisition element 3 with its terminal wires 4a, 4b is connected to the terminal areas (first TA terminal areas) 5 and or prior to installing the printed circuit board 7 at its final location at least the heating conductor 1 with its terminal ends 1a, 1b (HC terminal ends) is connected to the terminal areas 2. The electronics or evaluation unit 15 in turn is connected to a power supply 14 of the motor vehicle.

An additional, autonomous concept of the invention of the apparatus for heating according to the invention can be seen in that resistances can be set via the pcb traces 12, 13 of the printed circuit board 7 between the first HC terminal areas 2 and the second HC terminal areas 10 and/or between the first TA terminal areas 5 and the second TA terminal areas 11 by increasing or decreasing the areas of the pcb traces 12, 13 accordingly, possibly also via different thicknesses of the pcb traces 12, 13. A meander shape of the pcb traces is possible as well.

However, the areas of the pcb traces 12 that are provided between the first HC terminal areas 2 and the second HC terminal areas 10 for the heating conductor 1 on the printed circuit board 7 are preferably selected to be greater than the narrow, strip-shaped pcb traces 13 that are associated with the temperature acquisition element 3. The resistance of the pcb traces 12 is reduced through this large area of these pcb traces 12 and consequently, heat is generated by these pcb traces 12 depending on the size setting of the resistance. This heat is transferred to the pcb traces 13 for the temperature acquisition element 3 that run between the pcb traces 12 for the heating conductor 1, such that the measured temperature value that is detected by the temperature acquisition element 3 is influenced by the radiation heat or heat conductance across the printed circuit board 7. This is the case in particular when the temperature acquisition element 3 is positioned very close to the terminal areas 5 of the printed circuit board 7 or directly on the pcb traces 13 as is shown in the additional FIGS. 2 to 6.

To the extent that components that are comparable to each other are designated with the same reference sign in the various Figures, a description of these components of one embodiment can be transferred analogously to the other embodiment(s), without the need to describe such components again in detail.

In order to set the heat transfer from the pcb traces 12 of the heating conductor 1 to the pcb traces 13 for the temperature acquisition element 3 or directly to the temperature acquisition element 3, the area between the pcb traces 12 for the heating conductor 1 and the pcb trace 13 adjacent to it for the temperature acquisition element can be reduced or separated with a penetration 16. The penetration 16, or the slot, is preferably open towards the edge of the board 8. Furthermore, the heat transfer can be influenced via the length and/or width of the slot as shown based on the additional figures.

As apparent from a comparison of the various Figures, the size of the area of each pcb trace 12 for the heating conductor 1 can be in a range of four times, preferred ten times, and even more preferred twenty times the size of the area of a pcb trace 13 for the temperature acquisition element 3.

Also apparent from the Figures is that it is preferred to arrange the two first HC terminal areas 2 and the two second HC terminal areas 10 for the heating conductor 1 at the corner positions of the board 8. The areas that can be designed as solder, weld or crimp areas are shown enlarged in the Figures when compared to the overall size of the printed circuit board 7. The pcb traces 12 for the heating conductor 1 extend by area beginning from the respective first HC terminal area 2 and the respective second HC terminal area 10 toward the pcb traces 13 for the temperature acquisition element 3. The width of the pcb traces 13 for the temperature acquisition element 3 should be between 1 and 3 mm; the thickness of the pcb traces 12, 13 should be in a range of 10 to 140 μm, preferably in a range of 35 to 70 μm.

Figure 1B:
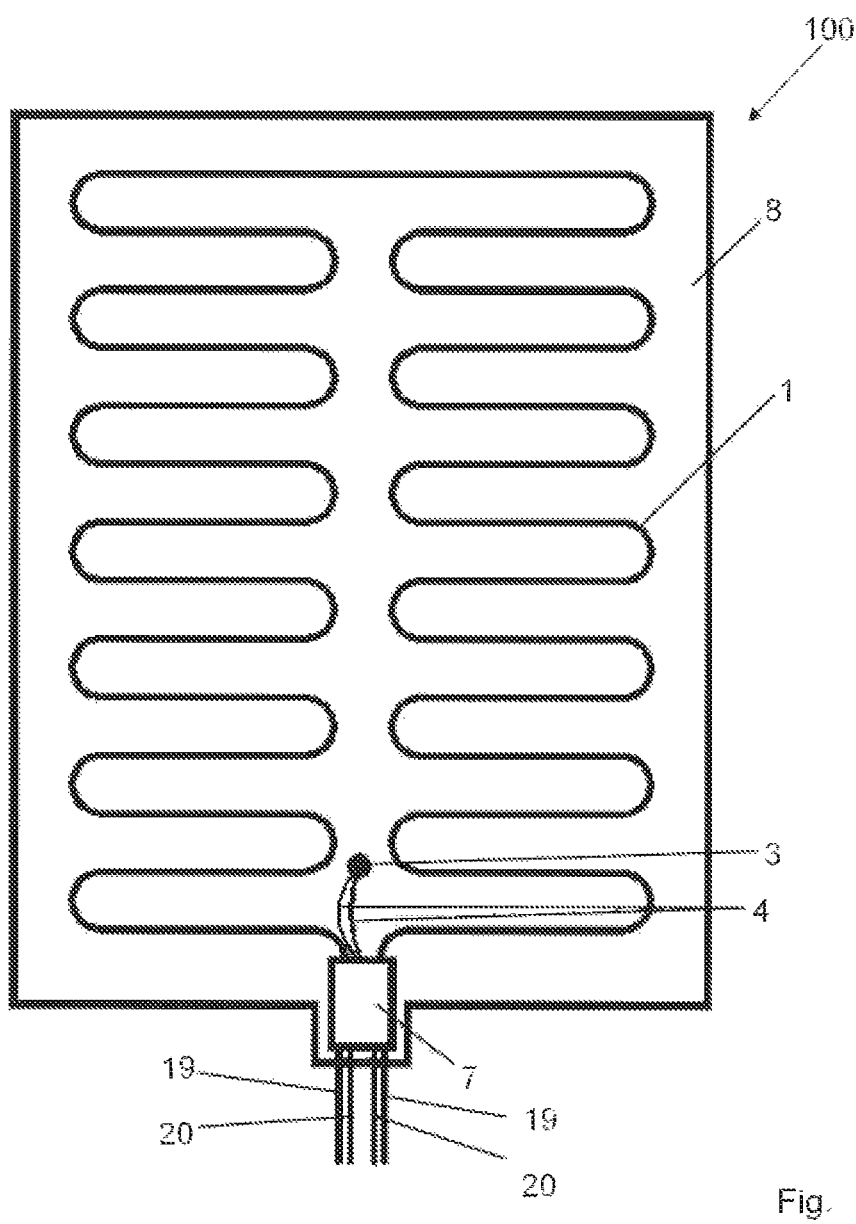
FIG. 1B shows an additional embodiment of the apparatus for heating according to the invention in a schematic presentation.

FIG. 1B shows the apparatus for heating according to the invention with a heating element 100 presented schematically. The heating conductor 1 and the temperature acquisition element 3 are applied to a carrier material 8. The printed circuit board 7 is in this embodiment arranged on the carrier material 8. Both textiles, knitted fabrics, non-wovens, tulle fabrics, foams, cellular rubber, but also plastics in the form of foils can be used as carrier material 8. It should be noted that the printed circuit board 7 is shown only schematically in FIG. 1B. Detailed designs for the printed circuit board 7 are shown in FIG. 1A and in FIGS. 2 to 6. The terminal leads 19 and the connection leads 20 that are connected to respective second HC terminal areas 10 and second TA terminal areas 11 both not shown in this FIG. 1B on the printed circuit board 7 are connected to the evaluation unit/electronics 15 also not shown in this FIG. 1B.

Figure 2:
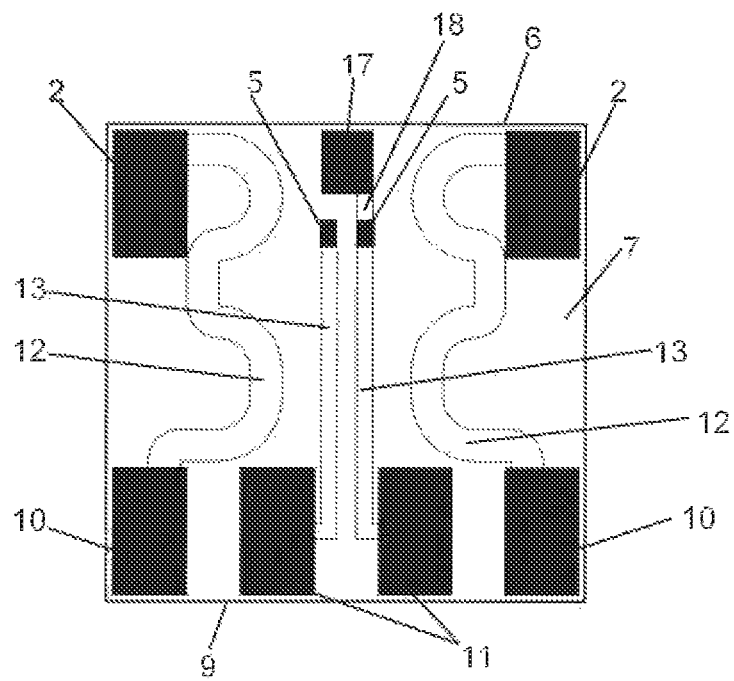
FIG. 2 shows a top view of a printed circuit board having a temperature acquisition element as an assembly component and with heat storage associated with the temperature acquisition element and with pcb traces running at least in part in a meander shape.
Figure 6:
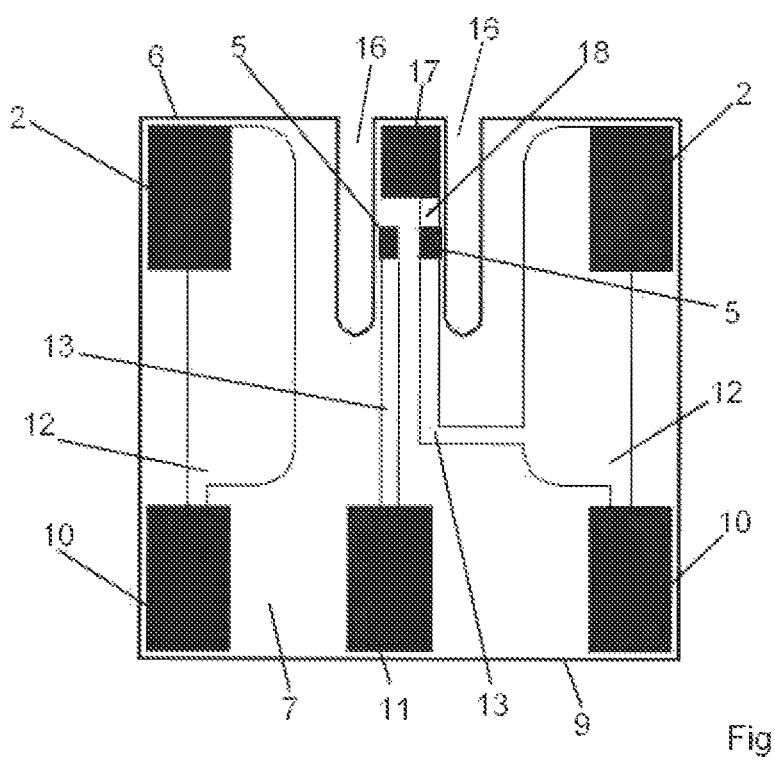
FIG. 6 shows an embodiment in which the one pcb trace that is associated with the temperature acquisition element is connected to the one pcb trace for the heating element.

In the embodiments as shown in FIGS. 2 and 6, the printed circuit board 7 is shown without temperature acquisition element since these Figures only serve the purpose of presenting additional embodiments of the pcb traces 12 and 13 of the printed circuit board 7.

Figure 3:
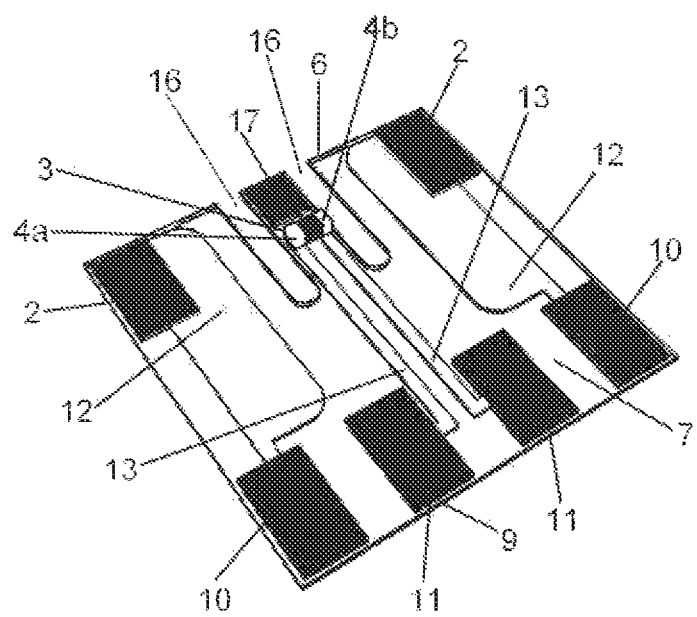
FIG. 3 shows a printed circuit board similar to FIG. 2 with additional penetrations in the area of the temperature acquisition element.
Figure 4:
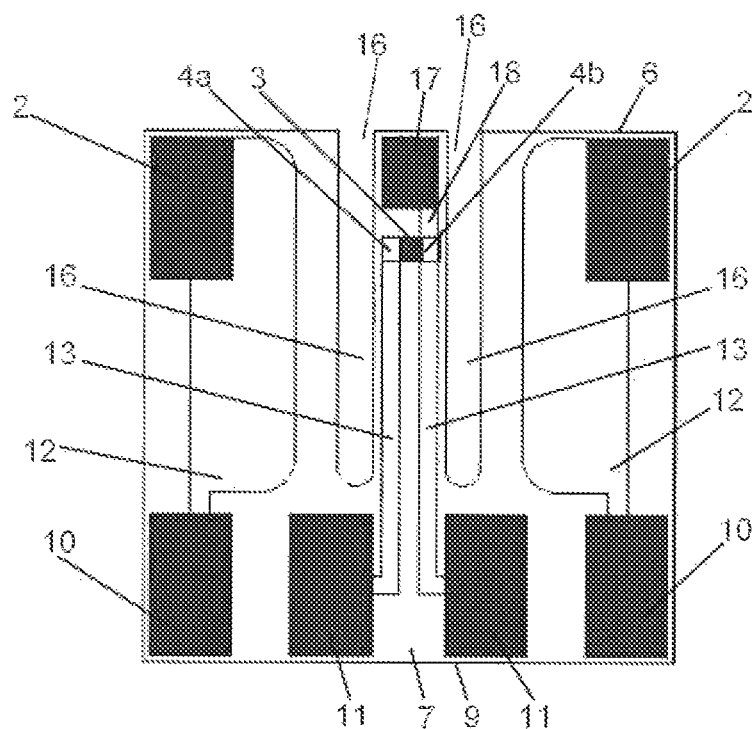
FIG. 4 shows a presentation of the printed circuit board with penetrations corresponding to FIG. 3 in top view but with a longer design compared to FIG. 3.
Figure 5:
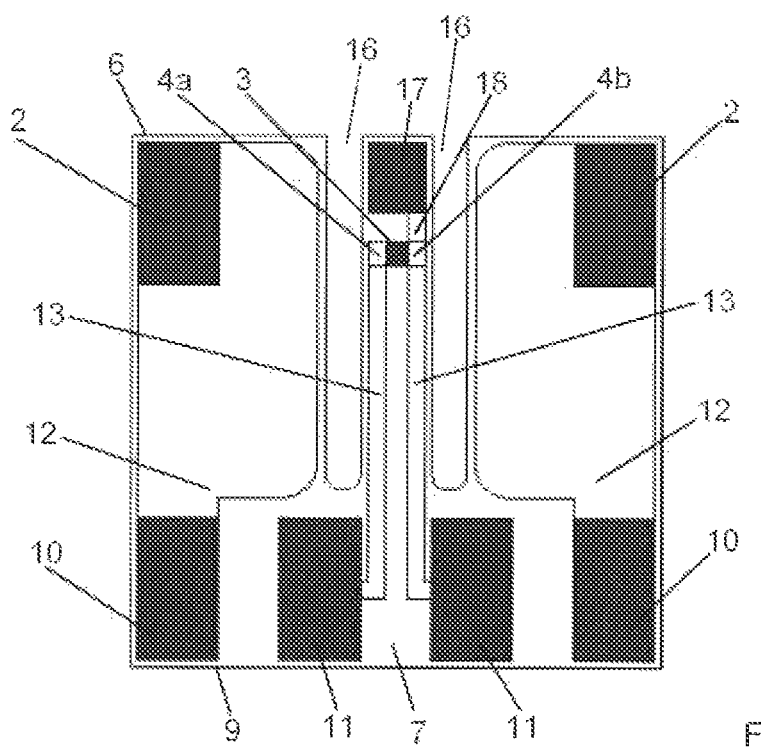
FIG. 5 shows the printed circuit board of FIG. 4 with pcb traces for the heating element that are larger in area compared to those of FIG. 4.

In the embodiments as shown in FIGS. 3 to 5, the temperature acquisition element 3 is designed as an SMD component with its TA terminal ends 4a, 4b being directly attached to the first TA terminal areas 5 of the pcb traces 13 such that the additional terminal wires 4 as seen in FIG. 1 are omitted. Furthermore, in this arrangement the temperature acquisition element 3 is arranged as a component of the printed circuit board 7 directly between the pcb traces 12 for the heating conductor 1 and is, therefore, exposed to the heat generated by the area of the pcb trace 12. Since the resistance of the pcb trace 12 and thus the generated heat of the pcb trace 12 changes with the heating energy of the heating conductor 1, the temperature acquisition element 3 detects the heat emitted by the pcb trace 12 that correlates to the heating temperature of the heating conductor 1.

In addition, a heat storage 17 is arranged in the area of the ends of the pcb traces 13 for the temperature acquisition element 3 in the embodiments of FIGS. 2 to 6 and is separated from the pcb traces 13; if necessary, this heat storage 17 is connected only with one pcb trace section 18, as can be seen clearly in FIGS. 2 and 4 to 6, to one of the pcb traces 13 via one TA terminal area 5. This heat storage 17 can be an accumulation of a material with good thermal conductivity such as solder. Alternatively, SMD components with defined thermal capacities that are in thermal contact with the temperature acquisition element 3 can be assembled. This heat storage 17 assumes the heat emitted by the pcb traces 12 for the heating conductor 1 and thus influences the inertia of the temperature acquisition element 3 during the temperature acquisition. The heat storage 17 is arranged at the edge of the printed circuit board 7 such that the two first TA terminal areas 5 for the temperature acquisition element 3 are spaced accordingly from the edge of the board 8.

Furthermore, FIG. 2 shows the respective pcb trace that is connected to the first HC terminal areas 2 and the second HC terminal areas 10 at least partially in a meander shape.

The comparison of FIGS. 4 and 5 shows how the area of the pcb traces 12 for the heating conductor 1 can be varied. In contrast to the embodiment as shown in FIG. 4, the area of the respective pcb trace 12 fills the entire area between the edge of the board 8 and the penetration 16, thus reducing the resistance of this pcb trace 12 versus the resistance of the pcb trace 12 of FIG. 4 and in turn keeping the heat input low.

FIG. 6 shows an embodiment in which the one pcb trace 13 for the temperature acquisition element is connected directly to the one pcb trace 12 for the heating conductor 1, such that the connection of this pcb trace 13 for the temperature acquisition element 3 is tapped via the second HC terminal area 10. As a result, a total of two second HC terminal areas 10 are present for the heating conductor 1 and a second TA terminal area 11 for the temperature acquisition element 3 at lower edge of the printed circuit board 7 in FIG. 6.

There has thus been shown and described a novel apparatus for heating surfaces in the internal space of a motor vehicle which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. Apparatus having at least one heating element for heating of surfaces in the internal space within a motor vehicle that can be touched by a user, said apparatus comprising (1) at least one heating conductor ("HC") forming an electrical heating circuit, (2) at least one carrier material selected from the group consisting of textiles, knitted fabrics, non-wovens, tulle fabrics, foams or foils of plastic and cellular rubber, and (3) a temperature sensing element ("TA") wherein the heating conductor is held by the carrier material and has at least two HC terminal ends and the temperature sensing element has at least two TA terminal ends, the improvement wherein at least two of the HC and TA terminal ends are electrically connected to first HC terminal areas or first TA terminal areas, respectively, of a printed circuit board ("pcb"), wherein the printed circuit board has second HC terminal areas and second TA terminal areas, wherein the first HC terminal areas and the second HC terminal areas are connected to each other at least in part via first pcb traces and the first TA terminal areas and the second TA terminal areas are connected to each other at least in part via second pcb traces, wherein the first and the second pcb traces are part of the printed circuit board and wherein the printed circuit board has a maximum dimension of 40 mm in each direction and is arranged on, under, or at, the at least one carrier material.

2. Apparatus for heating as in claim 1, wherein at least two of the first and second pcb traces of the printed circuit board have a defined thermal coupling by at least one of (a) their distance to each other, (b) removal of printed circuit board material, (c) slots in the printed circuit board and (d) selection of the printed circuit board material.

3. Apparatus for heating as in claim 1, wherein the first pcb traces that supply the heating conductor with heating conductor current set the heating energy generated by these first pcb traces by setting the width of the first pcb traces and by the path of the first pcb traces on the printed circuit board.

4. Apparatus for heating as in claim 1, wherein the second pcb traces at the first and second TA terminal areas with which the temperature sensing element is connected, run between the first pcb traces at the first and second HC terminal areas with which the heating conductor is connected.

5. Apparatus for heating as in claim 1, wherein the temperature sensing element is designed as a non-wired SMD component provided with TA terminal ends and is applied directly to the TA terminal areas of the printed circuit board.

6. Apparatus for heating as in claim 1, wherein the temperature sensing element is thermally coupled to heat storage made of a heat storing material.

7. Apparatus for heating as in claim 6, wherein the heat storage is an SMD component that is coupled to the temperature sensing element via at least one pcb trace section on the printed circuit board.

8. Apparatus for heating as in claim 2, wherein, in the area of the temperature sensing element, the printed circuit board has had material removed between the respective second pcb trace for the temperature sensing element and the respective adjacent first pcb trace for the heating conductor.

9. Apparatus for heating as in claim 8, wherein the printed circuit board has had such an amount of material removed that it has a penetration.

10. Apparatus for heating as in claim 9, wherein the penetration is open toward the edge of the printed circuit board.

* * * * *